(12) United States Patent
Feng et al.

(10) Patent No.: US 7,813,396 B2
(45) Date of Patent: Oct. 12, 2010

(54) TRANSISTOR LASER DEVICES AND METHODS

(75) Inventors: Milton Feng, Champaign, IL (US); Nick Holonyak, Jr., Urbana, IL (US); Gabriel Walter, Champaign, IL (US); Han Wui Then, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 12/384,772

(22) Filed: Apr. 8, 2009

(65) Prior Publication Data

US 2010/0085995 A1 Apr. 8, 2010

Related U.S. Application Data

(63) Continuation-in-part of application No. 12/287,697, filed on Oct. 10, 2008.

(60) Provisional application No. 60/998,645, filed on Oct. 12, 2007, provisional application No. 61/206,324, filed on Jan. 29, 2009.

(51) Int. Cl.
*H01S 5/34* (2006.01)
*H01S 5/062* (2006.01)

(52) U.S. Cl. .................. 372/43.01; 372/44.01
(58) Field of Classification Search .............. 372/43.01, 372/44.01
See application file for complete search history.

(56) References Cited

U.S. PATENT DOCUMENTS 5,550,854 A 8/1996 Chen et al. ............... 372/45.01
5,892,784 A 4/1999 Tan et al. ..................... 372/43
6,526,082 B1 2/2003 Corzine et al. ........... 372/46.01
7,091,082 B2 8/2006 Feng et al. .................. 438/235
7,244,997 B2 7/2007 Appelbaum et al. ......... 257/425
7,286,583 B2 10/2007 Feng et al. .................... 372/30
7,354,780 B2 4/2008 Feng et al. .................... 438/20
7,535,034 B2 * 5/2009 Walter et al. ................ 257/197

(Continued)

FOREIGN PATENT DOCUMENTS

JP 09-074246 3/1997

(Continued)

OTHER PUBLICATIONS

Ryzhil, "Heterostructure laser transistors controlled by resonant-tunneling electron extraction," Semicond. Sci. Technol., vol. 12, pp. 431-438, (1997).*

(Continued)

*Primary Examiner*—Minsun Harvey
*Assistant Examiner*—Michael Carter
(74) *Attorney, Agent, or Firm*—Martin Novack (57) ABSTRACT

A method for producing light emission from a semiconductor device includes the following steps: providing a semiconductor base region disposed between a semiconductor emitter region and a semiconductor collector region that forms a tunnel junction adjacent the base region; providing, in the base region, a region exhibiting quantum size effects; providing an emitter terminal, a base terminal, and a collector terminal respectively coupled with the emitter region, the base region, and the collector region; and applying electrical signals with respect to the emitter terminal, the base terminal and the collector terminal to produce light emission from the base region.

22 Claims, 8 Drawing Sheets

U.S. PATENT DOCUMENTS

| | | | |
|---|---|---|---|
| 2001/0050934 A1 | 12/2001 | Choquette et al. | 372/43 |
| 2002/0037022 A1 | 3/2002 | Fukagai | 372/46 |
| 2002/0131464 A1 | 9/2002 | Sirbu et al. | 372/45 |
| 2005/0040432 A1 | 2/2005 | Feng et al. | 257/198 |
| 2005/0054172 A1 | 3/2005 | Feng et al. | 438/313 |
| 2008/0240173 A1 | 10/2008 | Holonyak et al. | 372/9 |

FOREIGN PATENT DOCUMENTS

| | | |
|---|---|---|
| WO | WO97/20353 | 6/1997 |
| WO | WO99/05726 | 2/1999 |
| WO | WO2005/020287 | 3/2005 |
| WO | WO2006/093883 | 9/2006 |

OTHER PUBLICATIONS

Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004).

Quantum-Well-Base Heterojunction Bipolar Light-Emitting Transistor, M. Feng, N. Holonyak, Jr., and R. Chan, Appl. Phys. Lett. 84, 1952 (2004).

Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004).

Laser Operation Of A Heterojunction Bipolar Light-Emitting Transistor, G. Walter, N. Holonyak, Jr., M. Feng, and R. Chan, Appl. Phys. Lett. 85, 4768 (2004).

Microwave Operation And Modulation Of A Transistor Laser, R. Chan, M. Feng, N. Holonyak, Jr., and G. Walter, Appl. Phys. Lett. 86, 131114 (2005).

Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005).

Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006).

The Transistor Laser, N. Holonyak, M Feng, Spectrum, IEEE vol. 43, Issue 2, Feb. 2006.

Signal Mixing In A Multiple Input Transistor Laser Near Threshold, M. Feng, N. Holonyak, Jr., R. Chan, A. James, and G. Walter, Appl. Phys. Lett. 88, 063509 (2006).

Collector Current Map Of Gain And Stimulated Recombination On The Base Quantum Well Transitions Of A Transistor Laser, R. Chan, N. Holonyak, Jr., A. James, and G. Walter; Appl. Phys. Lett 88, 143508 (2006).

Collector Breakdown In The Heterojunction Bipolar Transistor Laser, G. Walter, A. James, N. Holonyak, Jr., M. Feng, and R. Chan Appl. Phys. Lett. 88, 232105 (2006).

High-speed (/spl ges/1 GHz) Electrical And Optical Adding, Mixing, And Processing Of Square-Wave Signals With A Transistor Laser, Milton Feng; N. Holonyak, Jr.; R. Chan; A. James; and G. Walter; Photonics Technology Letters, IEEE vol. 18 Issue: 11; Jun. 2006 pp. 1240-1242.

Graded-Base InGaN/GaN Heterojunction Bipolar Light-Emitting Transistors, B. F. Chu-Kung et al., Appl. Phys. Lett. 89, 082108 (2006).

Carrier LifeTime and Modulation Bandwidth Of A Quantum Well AlGaAs/InGaP/GaAs/InGaAs Transistor Laser, M. Feng, N. Holonyak, Jr., A. James, K. Cimino, G. Walter, and R. Chan; Appl. Phys. Lett. 89, 113504 (2006).

Chirp In A Transitor Laser: Franz-Keldysh Reduction Of The Linewidth Enhancement, G. Walter, A. James, N. Holonyak, Jr., and M. Feng; Appl. Phys. Lett. 90, 091109 (207).

Photon-Assisted Breakdown, Negative Resistance, And Switching In A Quantum-Well Transistor Laser; A. James, G. Walter, M. Feng, and N. Holonyak, Jr., Appl. Phys. Lett. 90, 152109 (2007).

Franz-Keldysh Photon-Assisted Voltage-Operated Switching Of A Transistor Laser; James,A,; Holonyak, N.: Feng, M.; Walter, G., Photonics Technology Letters, IEEE Volumn; 19 issue;9 May 1, 2007, pp. 680-682.

Experimental Determination Of The Effective Minority Carrier Lifetime In The Operation Of A Quantum-Well n-p-n. Heterojunction Biopolar Light-Emigging Transistor Of Varying Base Quantum-Well Design And doping; H.W. Then, M. Feng, N. Holonyak, Jr., and C.H.Wu, Appl. Phys. Lett. 91, 033505 (2007).

Charge Control Analysis Of Transistor Laser Operation; M. Feng, N. Holonyak, Jr., H.W. Then, and G. Walter; Appl. Phys. 91, 053501 (2007).

\* cited by examiner

| Material and Thickness | Dopant | Concentration (cm$^{-3}$) |
|---|---|---|
| 0.05 μm, n-In$_{0.49}$Ga$_{0.51}$P | | |
| 0.10 μm, n$^+$-GaAs | Si | 5E+18 |
| 0.03 μm, n$^+$-Al$_{0.40}$Ga$_{0.60}$As | Si | 3E+18 |
| 0.025 μm, n$^+$-Al$_{0.80}$Ga$_{0.20}$As | Si | 3E+18 |
| 0.40 μm, n$^+$-Al$_{0.92}$Ga$_{0.08}$As | Si | 3E+18 |
| 0.025 μm, n$^+$-Al$_{0.80}$Ga$_{0.20}$As | Si | 8E+17 |
| 0.03 μm, n$^+$-Al$_{0.40}$Ga$_{0.60}$As | Si | 5E+17 |
| 0.04 μm, n-In$_{0.49}$Ga$_{0.51}$P | Si | 3E+17 |
| 0.02 μm, p$^+$-GaAs | C | 5E+18 |
| 0.01 μm, p$^+$-GaAs | C | 5E+18 |
| 0.01 μm, p$^+$-GaAs | C | 5E+18 |
| 0.03 μm, p$^+$-GaAs | C | 1E+19 |
| 0.001 μm, i-GaAs | | |
| 0.002 μm, i-InGaAs | | |
| 0.015 μm, i-In$_{0.15}$Ga$_{0.85}$As | | |
| 0.002 μm, i-InGaAs | | |
| 0.001 μm, i-GaAs | | |
| 0.02 μm, p$^+$-GaAs | C | 2E+19 |
| 0.01 μm, p$^+$-Al$_{0.10}$Ga$_{0.90}$As | C | 6E+19 |
| 0.04 μm, n$^+$-GaAs | Si | 7E+18 |
| 0.03 μm, n$^+$-Al$_{0.40}$Ga$_{0.60}$As | Si | 3E+18 |
| 0.025 μm, n$^+$-Al$_{0.80}$Ga$_{0.20}$As | Si | 3E+18 |
| 0.40 μm, n$^+$-Al$_{0.95}$Ga$_{0.05}$As | Si | 3E+18 |
| 0.025 μm, n$^+$-Al$_{0.80}$Ga$_{0.20}$As | Si | 3E+18 |
| 0.03 μm, n$^+$-Al$_{0.40}$Ga$_{0.60}$As | Si | 3E+18 |
| 0.012 μm, n-In$_{0.49}$Ga$_{0.51}$P | Si | 5E+17 |
| 0.30 μm, n$^+$-GaAs | Si | 5E+18 |
| 0.04 μm, i-In$_{0.49}$Ga$_{0.51}$P | | |
| 0.50 μm, i-GaAs | | |
| SI-GaAs Substrate | | |

(a) Common-Emitter (b) Common-Base (c) Common-Collector

TRANSISTOR LASER DEVICES AND METHODS

PRIORITY CLAIMS

This is a continuation-in-part of copending U.S. patent application Ser. No. 12/287,697, filed Oct. 10, 2008, which claims priority from U.S. Provisional Patent Application Ser. No. 60/998,645, filed Oct. 12, 2007. Also, priority is claimed from U.S. Provisional Patent Application Ser. No. 61/206,324, filed Jan. 29, 2009.

FIELD OF THE INVENTION

This invention relates to methods and devices for producing light emission and laser emission in response to electrical signals. The invention also relates to methods for producing light emission and laser emission from semiconductor transistor devices, including such emission that can be controlled with very fast response time.

BACKGROUND OF THE INVENTION

A part of the background hereof lies in the development of wide bandgap semiconductors to achieve high minority carrier injection efficiency in a device known as a heterojunction bipolar transistor (HBT). These transistor devices are capable of operation at extremely high speeds. For example, InP HBTs have, in recent years, been demonstrated to exhibit operation at speeds above 500 GHz.

Another part of the background hereof lies in the development of heterojunction bipolar transistors which operate as light-emitting transistors and laser transistors. Reference can be made for example, to U.S. Pat. Nos. 7,091,082, 7,286,583 and 7,354,780, and to the following: U.S. patent application Ser. No. 10/646,457, filed Aug. 22, 2003; U.S. patent application Ser. No. 11/364,893, filed Feb. 27, 2006; and U.S. patent application Ser. No. 11/805,859, filed May 24, 2007; PCT International Patent Publication Number WO/2005/020287, published Mar. 3, 2005, and PCT International Patent Publication Number WO/2006/006879 published Aug. 9, 2006; all the foregoing being assigned to the same assignee as the present Application. Reference can also be made to the following publications: Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004); Quantum-Well-Base Heterojunction Bipolar Light-Emitting Transistor, M. Feng, N. Holonyak, Jr., and R. Chan, Appl. Phys. Lett. 84, 1952 (2004); Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004); Laser Operation Of A Heterojunction Bipolar Light-Emitting Transistor, G. Walter, N. Holonyak, Jr., M. Feng, and R. Chan, Appl. Phys. Lett. 85, 4768 (2004); Microwave Operation And Modulation Of A Transistor Laser, R. Chan, M. Feng, N. Holonyak, Jr., and G. Walter, Appl. Phys. Lett. 86, 131114 (2005); Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005); Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006); The Transistor Laser, N. Holonyak and M Feng, Spectrum, IEEE Volume 43, Issue 2, February 2006; Signal Mixing In A Multiple Input Transistor Laser Near Threshold, M. Feng, N. Holonyak, Jr., R. Chan, A. James, and G. Walter, Appl. Phys. Lett. 88, 063509 (2006); and Collector Current Map Of Gain And Stimulated Recombination On The Base Quantum Well Transitions Of A Transistor Laser, R. Chan, N. Holonyak, Jr., A. James, and G. Walter, Appl. Phys. Lett. 88, 14508 (2006); Collector Breakdown In The Heterojunction Bipolar Transistor Laser, G. Walter, A. James, N. Holonyak, Jr., M. Feng, and R. Chan, Appl. Phys. Lett. 88, 232105 (2006); High-Speed (/spl ges/1 GHz) Electrical And Optical Adding, Mixing, And Processing Of Square-Wave Signals With A Transistor Laser, M. Feng, N. Holonyak, Jr., R. Chan, A. James, and G. Walter, Photonics Technology Letters, IEEE Volume: 18 Issue: 11 (2006); Graded-Base InGaN/GaN Heterojunction Bipolar Light-Emitting Transistors, B. F. Chu-Kung et al., Appl. Phys. Lett. 89, 082108 (2006); Carrier Lifetime And Modulation Bandwidth Of A Quantum Well AlGaAs/InGaP/GaAs/InGaAs Transistor Laser, M. Feng, N. Holonyak, Jr., A. James, K. Cimino, G. Walter, and R. Chan, Appl. Phys. Lett. 89, 113504 (2006); Chirp In A Transistor Laser, Franz-Keldysh Reduction Of The Linewidth Enhancement, G. Walter, A. James, N. Holonyak, Jr., and M. Feng, Appl. Phys. Lett. 90, 091109 (2007); Photon-Assisted Breakdown, Negative Resistance, And Switching In A Quantum-Well Transistor Laser, A. James, G. Walter, M. Feng, and N. Holonyak, Jr., Appl. Phys. Lett. 90, 152109 (2007); Franz-Keldysh Photon-Assisted Voltage-Operated Switching of a Transistor Laser, A. James, N. Holonyak, M. Feng, and G. Walter, Photonics Technology Letters, IEEE Volume: 19 Issue: 9 (2007); Experimental Determination Of The Effective Minority Carrier Lifetime In The Operation Of A Quantum-Well n-p-n Heterojunction Bipolar Light-Emitting Transistor Of Varying Base Quantum-Well Design And Doping; H. W. Then, M. Feng, N. Holonyak, Jr., and C. H. Wu, Appl. Phys. Lett. 91, 033505 (2007); Charge Control Analysis Of Transistor Laser Operation, M. Feng, N. Holonyak, Jr., H. W. Then, and G. Walter, Appl. Phys. Lett. 91, 053501 (2007); Optical Bandwidth Enhancement By Operation And Modulation Of The First Excited State Of A Transistor Laser, H. W. Then, M. Feng, and N. Holonyak, Jr., Appl. Phys. Lett. 91, 183505 (2007); Modulation Of High Current Gain (β>49) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007); Collector Characteristics And The Differential Optical Gain Of A Quantum-Well Transistor Laser, H. W. Then, G. Walter, M. Feng, and N. Holonyak, Jr., Appl. Phys. Lett. 91, 243508 (2007), Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008).

Fundamental to the transistor is the base and base current. This is evident at once from the original transistor of Bardeen and Brattain (J. Bardeen and W. H. Brattain, Phys. Rev. 74, 230 (1948)), the point contact transistor with only, and uniquely, the base region semiconductor material. The base current ($I_B$) separates the low impedance input, the minority "emitter" current ($I_E$), from the high impedance output, the "collector" current ($I_C$), thus yielding a "transfer resistor" ($I_E + I_B + I_C = 0$, $\beta = \text{gain} = |I_C/I_B|$, $\beta \geq 10$, $I_E > I_C$, $I_B > 0$). If now, over 60 years later, one considers the highest speed transistor (see W. Snodgrass, B. R. Wu, K. Y. Cheng, and M. Feng, IEEE Intl. Electron Devices Meeting (IEDM), pp. 663-666 (2007)), the n-p-n heterojunction bipolar transistor (HBT), which operates at small size and high current density, there is enough base current (and recombination) in a small enough volume, say, of "good" geometry, to change spontaneous recombination into stimulated recombination. This can be the basis of a transistor laser (TL) (see G. Walter, N. Holonyak, Jr., M. Feng, and R. Chan, Appl. Phys. Lett. 85, 4768 (2004)), particularly if quantum wells are inserted into the base region to control the recombination (trading-off electrical gain β for optical gain) and if, moreover, the base region, adapted to be a resonator, is afforded adequate Q. As has been shown (see A. James, N. Holonyak, Jr., M. Feng, and G. Walter, IEEE Photonics Technol. Lett. vol. 19, 680 (2007)), the recombination optical signal, via internal Franz-Keldysh (FK) absorption (see C. M. Wolfe, N. Holonyak, Jr., and G. E. Stillman, Physical Properties of Semiconductors, Prentice Hall, Englewood Cliffs, N.J., pp. 219-220 (1989)), causes voltage-dependent breakdown and negative resistance in the TL collector characteristics (see A. James, G. Walter, M. Feng, and N. Holonyak, Jr., Appl. Phys. Lett. 90, 152109 (2007)). Other characteristics, properties, and applications of transistor lasers and light emitting transistors are described in detail in the above-referenced publications and patent documents.

It is among the objectives of the present invention to improve on the efficiency and flexibility of operation of transistor lasers and their applications.

SUMMARY OF THE INVENTION

In the parent Application hereof, U.S. patent application Ser. No. 12/287,697, filed Oct. 10, 2008, there is disclosed, inter alia, a two-terminal tunnel junction laser with a collector tunnel junction; that is, an n-p$^+$-n$^+$ tunnel junction laser with electrical contacts on the emitter and collector layers. In the disclosure hereof, there is set forth, inter alia, a three-terminal transistor laser and method in which a collector tunnel junction is used to great advantage.

A form of the invention is directed to a method for producing light emission from a semiconductor device, including the following steps: providing a semiconductor base region disposed between a semiconductor emitter region and a semiconductor collector region that forms a tunnel junction adjacent the base region; providing, in the base region, a region exhibiting quantum size effects; providing an emitter terminal, a base terminal, and a collector terminal respectively coupled with the emitter region, the base region, and the collector region; and applying electrical signals with respect to the emitter terminal, the base terminal and the collector terminal to produce light emission from the base region.

In embodiments of this form of the invention the step of providing, in the base region, a region exhibiting quantum size effects, can comprise, for example, providing a quantum well in the base region and/or a layer of quantum dots in the base region. A plurality of quantum size regions can also be employed. A preferred embodiment of this form of the invention further comprises the step of providing an optical resonant cavity enclosing at least a portion of the base region. The cavity is partially transmissive, and the light emission comprises laser emission. In an embodiment of this form of the invention, the step of applying said electrical signals includes reverse biasing the tunnel junction, whereby electrons injected into the base region, via the emitter, recombine, in the base region, with holes generated by the tunnel junction contributing to the laser emission. Also in this embodiment, the step of applying said electrical signals includes providing input current to the base terminal to obtain further carrier recombination in the base region, also contributing to the laser emission. The carrier recombining, in the base region, is substantially aided by the region exhibiting quantum size effects. In a preferred embodiment of this form of the invention, the step of providing a semiconductor base region disposed between a semiconductor emitter region and a semiconductor collector region that forms a tunnel junction adjacent the base region includes: providing an emitter region that comprises an n-type layer; providing a base region that comprises a plurality of p+ layers; and providing a collector region that comprises an n+ layer adjacent a p+ layer of the base region to form said tunnel junction.

A form of the invention is directed to a three terminal semiconductor device for producing light emission in response to electrical signals, comprising: a semiconductor base region disposed between a semiconductor emitter region and a semiconductor collector region that forms a tunnel junction adjacent the base region; the base region having a region therein exhibiting quantum size effects; and an emitter terminal, a base terminal, and a collector terminal respectively coupled with the emitter region, the base region and the collector region; whereby application of said electrical signals with respect to the emitter, base, and collector terminals, causes light emission from the base region. An optical resonant cavity encloses at least a portion of the base region, and the light emission comprises laser emission. In an embodiment of this form of the invention, the emitter region comprises an n-type layer; the base region comprises a plurality of p+ layers; and the collector region comprises an n+ layer adjacent a p+ layer of the base region to form the tunnel junction.

In a further form of the invention, a method is set forth for producing laser emission modulated with mixed signals representative of a first RF input comprising an input current and a second RF input comprising an input voltage, including the following steps: providing a semiconductor base region disposed between a semiconductor emitter region and a semiconductor collector region that forms a tunnel junction adjacent the base region; providing, in the base region, a region exhibiting quantum size effects; providing an optical resonant cavity enclosing at least a portion of the base region; providing an emitter terminal, a base terminal, and a collector terminal respectively coupled with the emitter region, the base region, and the collector region; and applying electrical signals with respect to the emitter terminal, the base terminal and the collector terminal to produce said laser emission from the base region, said applying of electrical signals including application of the first RF input to the base terminal, and said applying of said electrical signals further including reverse biasing of the tunnel junction and application of the second RF input across the collector terminal with respect to another of the terminals. In an embodiment of this form of the invention, the optical output includes mixed multiples of the frequencies of said first and second input signals. In one embodiment, said another of said terminals comprises the emitter terminal, and in another embodiment, said another of said terminals comprises the base terminal.

As will be described further, in three-terminal form, in transistor configuration, minority electrons are supplied by the emitter via forward bias injection, and the holes for electron-hole recombinations at the quantum-well (QW) are supplied by the usual base terminal ohmic current, $I_B$, as well as by collector tunneling, $I_{fkT}+I_{rT}$. Because $I_B$ can be supplied independent of the base-collector bias voltage, it can sustain a certain photon density in the resonator cavity (proportional to $I_B$), which can then be employed to assist in collector tunneling, hence the term "photon-assisted tunneling". Therefore, the three-terminal form makes possible a way to establish the initial photon density (via $I_B$) that consequently leads to the enhancement of laser operation by efficiently delivering holes to the recombination center (QW and waveguided region) by photon-assisted tunneling. These holes need only traverse a relatively short vertical distance (for example, ~30 nm) compared to the much larger lateral distances (for example, ~5 μm) traversed (via relaxation) by a hole supplied by $I_B$ (with attendant large ohmic loss).

Among the advantages of the methods and devices hereof (which are sometimes referred to by Applicant as "tunnel junction transistor laser" (TJ-TL) methods and devices), are the following: (a) The collector tunnel junction re-supplies holes to the base region at greater efficiencies, which is advantageous for design of lasers with low threshold and high external quantum efficiency. (b) The collector tunnel junction's sensitivity to third terminal voltage control enables a direct voltage-controlled modulation capability in addition to a direct current modulation capability. (c) Direct voltage modulation of a tunnel junction transistor laser can produce a high extinction ratio with low voltage swing due to its relatively strong coupling and close proximity (for example, ~30 nm) to the photon generation center (quantum-well). (d) Direct voltage modulation of a tunnel junction transistor laser results in low photon coupling loss because the tunnel junction is an integral part of the device. (It is formed as part of the collector and its design.) In contrast, existing monolithic solutions involving separate lasers and external modulators (all hooked together) suffer coupling losses and manufacturing yield issues due to difficulty in material growth and alignment. (e) The ability to operate in both current and voltage modulation circuit formats allows signal mixing employing two input electrical ports. (f) The collector junction enables an improved internal base signal feedback loop involving photon-assisted tunneling. This offers an internal mechanism for more efficient implementation of feedback circuit strategies because of the minimal loss of signal strength. In existing feedback implementations involving two-terminal diode lasers, the photon signal is subject to an external photodetector, and then converted to an electrical signal before it is fed back into the laser input. It involves many components and incurs large coupling and conversion losses. (g) The collector tunnel junction adds a new dimension to design of input impedance matching. (h) The collector tunnel junction improves isolation between the two electrical ports, and is advantageous for alleviating isolation issues in large devices. Good isolation between the ports is beneficial for signal processing, such as for signal mixing utilizing the two ports as inputs.

Further features and advantages of the invention will become more readily apparent from the following detailed description when taken in conjunction with the accompanying drawings.

DETAILED DESCRIPTION

As described further hereinbelow, high p+ and n+ tunnel-junction doping are employed at the collector of a transistor laser (TL) to enable the laser operation to be more effectively controlled by changes in bias (voltage), which makes possible a direct voltage modulation circuit format in addition to the usual direct current modulation. The collector tunnel junction, as used herein, is a major source of hole re-supply to the base, and to recombination, complementing and competing with the usual base current $I_B$. As will be demonstrated, the collector tunnel junction leads to a sensitive region, a voltage-dependent "sweet spot", in the laser operation. The tunnel junction can be used to enhance transistor laser operation and simultaneously it can be quenched by photon-assisted (FK) tunneling, thus adding significantly to TL flexibility and use.

Figure 1:
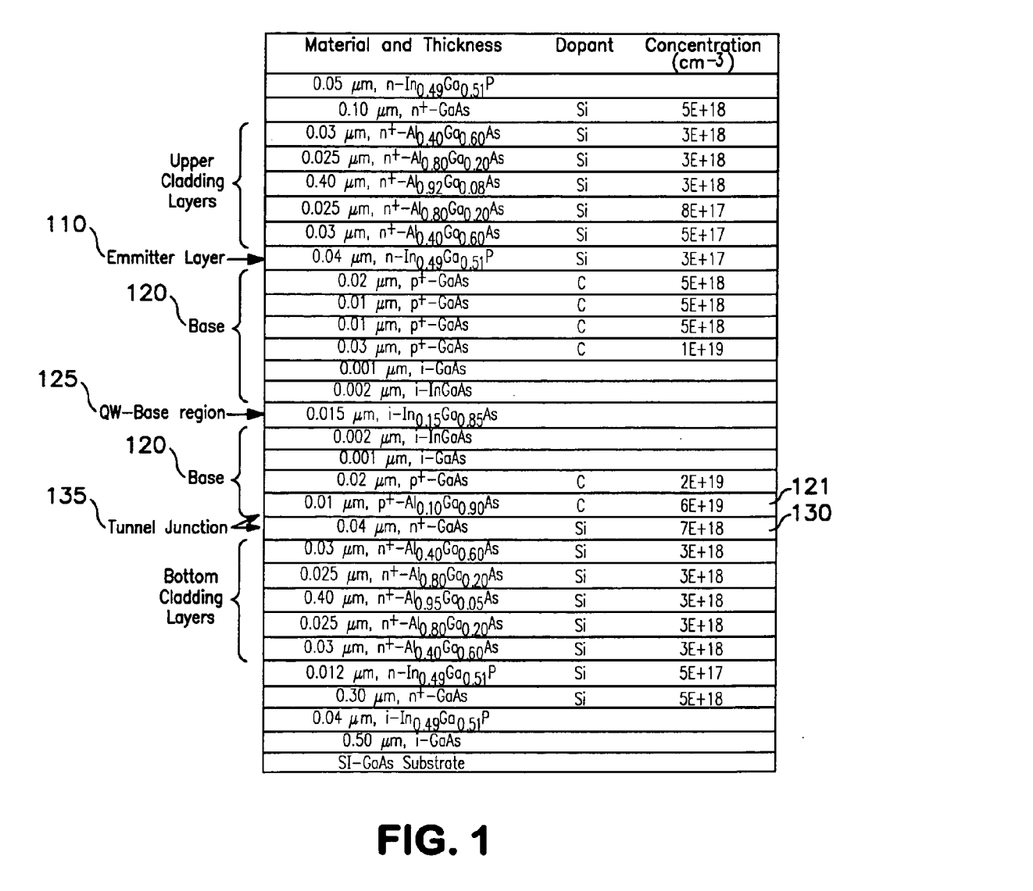
FIG. 1 is a diagram, not to scale, of the layer structure of a tunnel junction transistor laser (TJ-TL) in accordance with an exemplary embodiment of the invention.

The n-InGaP/p+-GaAs/n+-GaAs tunnel junction HBT layer structure of an example hereof, and a comparison n-InGaP/p+-GaAs/n−-GaAs HBT structure without a collector tunnel junction, are grown on a GaAs substrate by MOCVD. The detailed tunnel junction HBT structure is shown in FIG. 1. It includes: a 40 nm $In_{0.49}Ga_{0.51}P$ emitter 110, Si-doped to $3\times10^{17}$ cm$^{-3}$; an 85 nm GaAs base 120 (with p+ and transition layers as shown), C-doped to $1\times10^{19}$ cm$^{-3}$; a single undoped 15 nm $In_{0.15}Ga_{0.85}As$ base-region quantum well 125 at wavelength, $\lambda \approx 980$ nm, and a 40 nm n+ GaAs collector 130, Si-doped to $7 \times 10^{18}$ cm$^{-3}$. (As seen, in this example, the tunnel junction, labeled 135, comprises the n+ collector forming a tunnel junction adjacent the p+ base; i.e., in this case the (n+) (p+) tunnel junction comprises collector layer 130 and layer 121 of the base region 120. It will be understood that this corresponds to calling the adjacent layers 130-121 the "collector".) Conventional upper and bottom cladding, contact layers, etch stop layers, etc. are as shown in FIG. 1. The comparison HBT-TL structure is essentially identical to the tunnel junction HBT structure except its collector is a 60 nm GaAs layer, Si-doped to $2 \times 10^{16}$ cm$^{-3}$ (not directly tunneling as-grown, as-doped). The fabrication techniques for this example are of the type disclosed in M. Feng, N. Holonyak, Jr., G. Walter, and R. Chan, Appl. Phys. Lett. 87, 131103 (2005) and in M. Feng, N. Holonyak, Jr., A. James, K. Cimino, G. Walter, and R. Chan, Appl. Phys. Lett. 89, 113504 (2006), incorporated herein by reference. As described therein, the various transistor contacts are realized by top-down metallization on ledges, steps, or apertures processed by photolithography and etching down to the relevant epitaxial layers of the TL crystal. For convenience in cleaving and heat sinking, the metallized wafer is lapped to a thickness of ~70 μm. Experimental samples with 6 μm emitter mesa widths (reduced to a 4.5 μm active width by edgewise oxidation of one of the top AlGaAs layers) and with 3 μm wide base contacts at 5 μm spacings from the emitter edges are cleaved normal to the emitter stripes to form Fabry-Perot end facets with 400 μm spacings.

It will be understood that while an edge-emitting laser is utilized for the examples hereof, other resonant cavity configurations, such as a vertical cavity configuration, can alternatively be fabricated using, for example, upper and lower reflecting layers such as DBRs.

Figure 2:
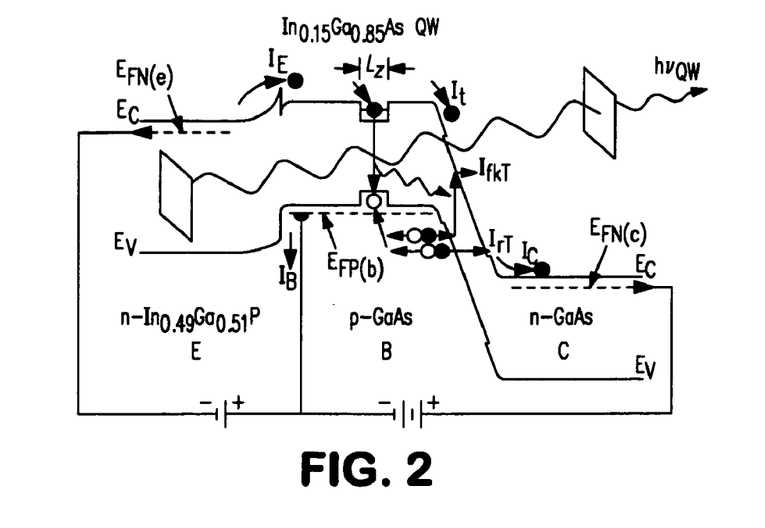
FIG. 2 is a schematic band diagram of a TJ-TL of the type represented in FIG. 1, shown with a generic resonator cavity.

FIG. 2 shows the schematic band diagram of the n-p-n tunnel junction transistor laser (TJ-TL), biased as shown, and with the key physical processes labeled. The resonator cavity reflectors are represented by the shaded squares. The emitter, base, and collector regions are labeled E, B, and C, respectively. $I_E$ is the emitter current (minority current in the base) with the junction in forward bias; $I_B$ is the re-supply of holes by the usual base ohmic contact; $I_{fkT}$ is the re-supply to the base of holes by the FK photon-assisted tunneling; $I_{rT}$ represents the re-supply to the base of holes via the direct tunneling of electrons; and $I_t$ is the usual minority carriers current that do not recombine in the base and are collected. The collector current $I_C$ consists of the usual transport component across the base $I_t$, the Franz-Keldysh portion $I_{fkT}$, and the direct tunnel junction current $I_{rT}$, or, $$I_C = I_t + I_{rT} + I_{fkT}. \quad (1)$$

The base recombination current, $I_{Br}$, is expressed as the sum of the hole components, or, $$I_{Br} = I_B + I_{fkT} + I_{rT}. \quad (2)$$

Figure 3:
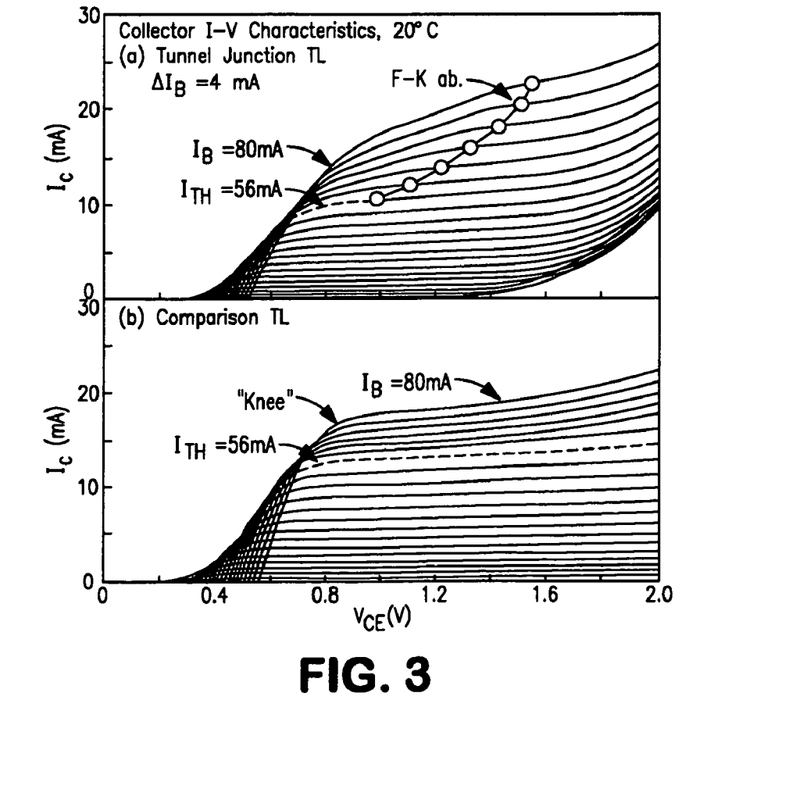
FIG. 3 shows the collector I-V characteristics of (a) a TJ-TL in accordance with an embodiment hereof, and (b) a comparison transistor laser (TL) without a collector tunnel junction. Below the "knee" voltages, the transistors are biased in saturation. The tunneling process is evident from the slope of the collector current, $I_C$, vs emitter-collector voltage bias, $V_{CE}$ (0.4-1.6 V), which otherwise would be "flat" as in the collector I-V of the (b) comparison TL.
Figure 4:
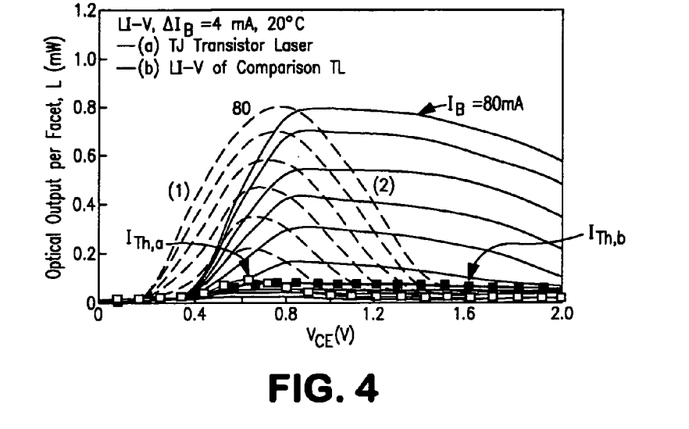
FIG. 4 shows the dependence of optical output of the TJ-TL (of FIGS. 1 and 2) on $V_{CE}$, indicating the enhancement ($V_{CE}$<0.8 V) and quenching ($V_{CE}$≧0.8 V) of the laser output by Franz-Keldysh (FK) photon-assisted tunneling (photon absorption). The LI-V of the comparison TL (b) shows similar behavior occurring gradually only at higher $V_{CE}$≧1.6 V.
Figure 5:
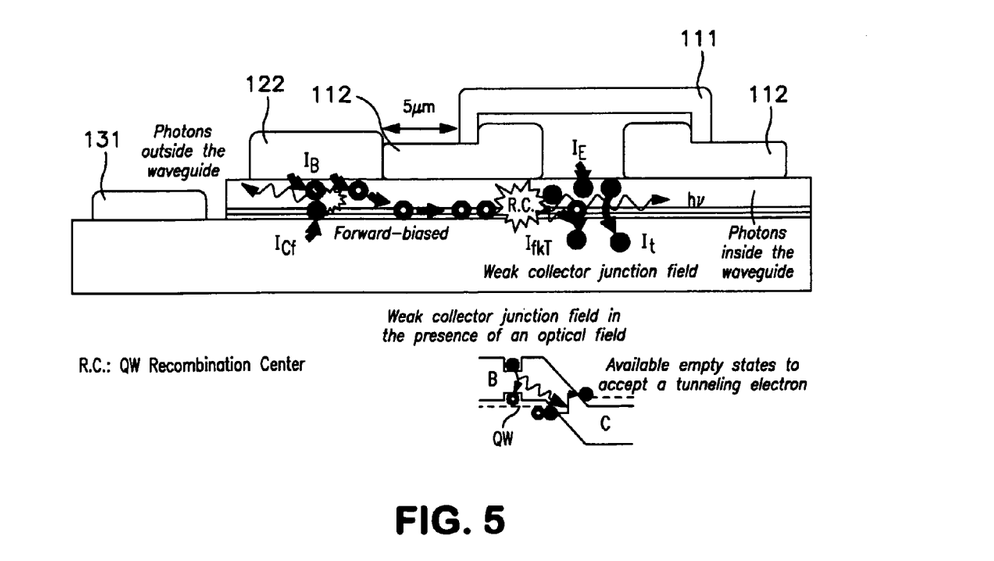
FIG. 5 is a schematic device cross-section illustrating the various processes shown in FIG. 2. The band diagram below the device shows the base quantum well and tunnel junction.

FIG. 3 shows the collector I-V characteristics of (a) the TJ-TL, and (b) the comparison TL of lesser collector doping and no tunnel junction. The forward-active mode of the TJ-TL operation (i.e., the base-collector junction in reverse bias) is indicated by the collector current, $I_C$, being nearly constant (i.e., "flat") despite further increase in $V_{CE}$ beyond the "knee" voltages of 0.4 V ($I_B$=56 mA) to 0.8 V ($I_B$=80 mA). The effects of collector tunneling (FIG. 3a) are evident from the upward slope in the collector current, $I_C$ vs $V_{CE}$, that otherwise would be photon gain established by emitter and base carrier injection ($I_E$, $I_B$>0). However, under stronger reverse-biased collector junction field (region 2 of FIG. 4), the optical output is reduced and subsequently quenched by Franz-Keldysh absorption. The collector tunnel junction, as a consequence, enables the laser output to be controlled effectively by the use of a third terminal control voltage. This enables the TJ-TL to be directly modulated via the usual current control ($\delta I_E$, $\delta I_B$) as well as now voltage control ($\delta V_{CE}$, $\delta V_{BC}$). Despite relying on only the bulk FK effect, the proximity of the collector tunnel junction to the photon generation center (QW), and the strong coupling of the tunneling process to the cavity optical field, the result is a sensitive response of the stimulated optical field to voltage control, resulting in a high extinction ratio (ER), or "on-off" ratio. In FIG. 3 the laser can be switched, for example, from a high output of 800 μW to a low output of 30 μW ($I_B$=80 mA), achieving an ER of 15 dB over a change in $V_{CE}$ (third terminal control) of only 0.8 V. A low voltage-swing with a high ER is especially advantageous for making highly efficient, low power voltage-controlled lightwave modulators.

Figure 6:
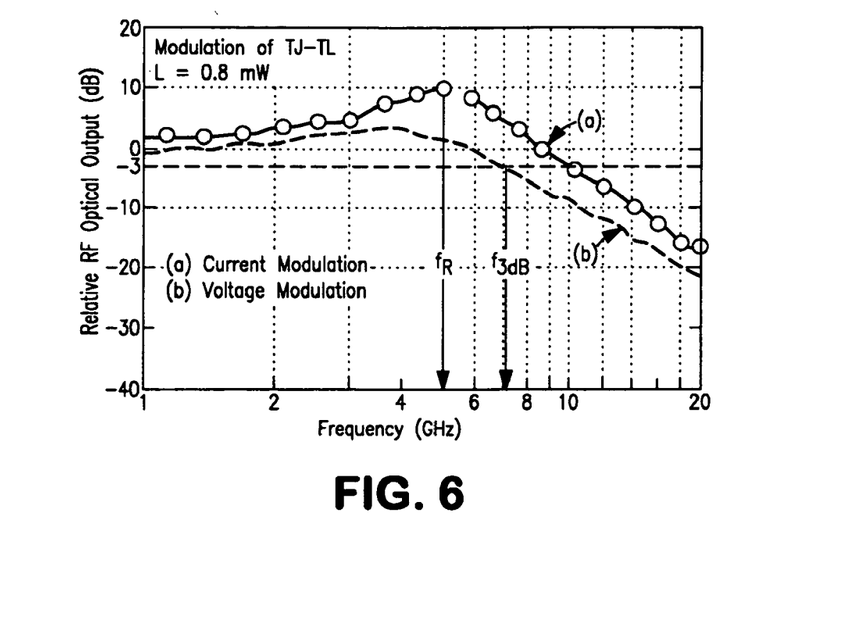
FIG. 6 shows the modulation characteristics of a common-emitter TJ-TL biased in: (a) region 1 of FIG. 3 with $I_B$=90 mA, $V_{CE}$=0.52 V, and BE RF-input current modulation; (b) region 2 with $I_B$=90 mA, $V_{CE}$=1.08 V, and CE RF-input voltage modulation. The optical outputs are equal in both cases.

FIG. 6 shows the modulation characteristics of a common-emitter TJ-TL at two different biases. The biases are chosen so as to maintain the same photon densities in each case. A resonance-constrained modulation response with photon-carrier relaxation oscillation at frequency $f_R$ is obtained with the BC junction forward biased in FIGS. 6 (a) and (b). In this mode of operation, the TJ-TL is biased in saturation (i.e., two forward biased p-n junctions) as is identified in the regime before the "knee" of the I-V characteristics of FIG. 3 and operating region (1) of FIG. 4. However, when operated in the forward-active mode (region 2 of FIG. 4), the modulation response is free of resonance, extending the usable bandwidth to its greater 3 dB bandwidth, $f_{3\ dB}$. The "tilt" in the base charge population, imposed by the boundary condition at the reverse-biased BC junction, removes the (saturated) charge "pile-up", and together with the voltage-controlled photon absorption (FK tunneling) at the collector, contributes to the relatively "flat" response (b) of FIG. 6. The performance of the TJ-TL employed for the present example is still limited by its large geometry and its prototypical layer structure, resulting in undesirable parasitic delay elements.

Figure 7:
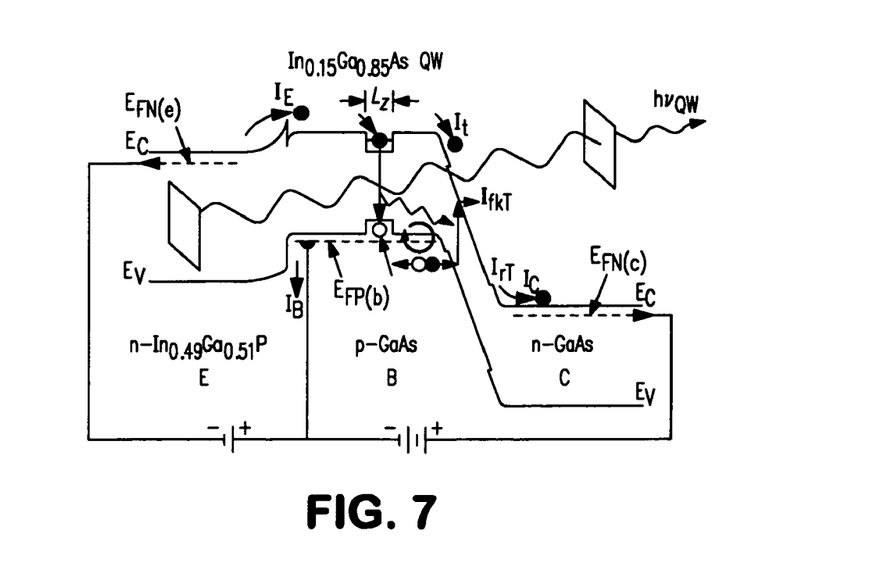
FIG. 7 is a schematic band diagram illustrating the internal feedback loop of a TJ-TL involving photon-assisted tunneling at the collector junction. Photon signals are "detected" and converted into hole currents that are channeled back into the base region.
Figure 8:
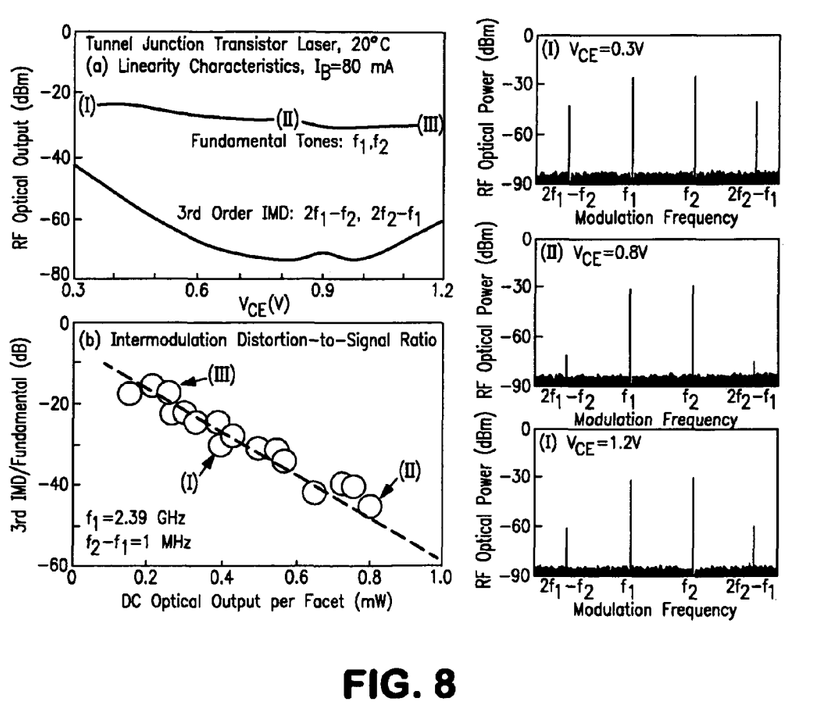
FIG. 8 shows (a) the magnitude of the fundamental signal ($f_1$, $f_2$) and the $3^{rd}$ order intermodulation products ($2f_2-f_1$, $2f_1-f_2$) as device bias voltage $V_{CE}$ is varied, and (b) dependence of the intermodulation distortion-to-signal ratio on the optical output per facet.

It is noted that the photon-assisted tunneling in a TJ-TL forms a mechanism for internal base signal feedback as shown in FIG. 7. The photon generated from base recombination is absorbed or 'detected' by a tunneling electron from base to collector. This result in a feedback signal that is proportional to the photon output and in the form of a hole current re-supplied back into the base. The holes that are fed back to the base raise the electrical potential of the base, which in turn, increases the base-emitter potential difference, causing more minority electrons to be injected into the base from the emitter. This is unique to the triode. The feedback signal has a phase that depends on the delay time between the photon signal "detected" at the collector junction and the resultant change in the base-emitter potential, as well as the relative phase between base-emitter and base-collector voltage. The delay time and phase relationships may thus be modified by changing the layer structure design (e.g., by varying the distance between the QW and the collector tunnel junction) as well as by external circuit elements (e.g., load, $Z_L$) and three-terminal circuit configurations (e.g., common-emitter, common-base, or common-collector). FIG. 8 shows the third order intermodulation outputs of a common-emitter TJ-TL, and its dependence on bias voltage, $V_{CE}$. While the signal strength of the fundamental "tones" at $f_1$ and $f_2$ remain unchanged, the strength of the feedback signal depends on the cavity photon density and the collector junction field strength (bias voltage, $V_{CE}$). The capability to internally generate feedback signals of magnitude governed by a third terminal voltage control can lead to more efficient implementation of feedback strategies for reduction of distortions in both the electrical and optical outputs of the transistor laser.

Figure 9:
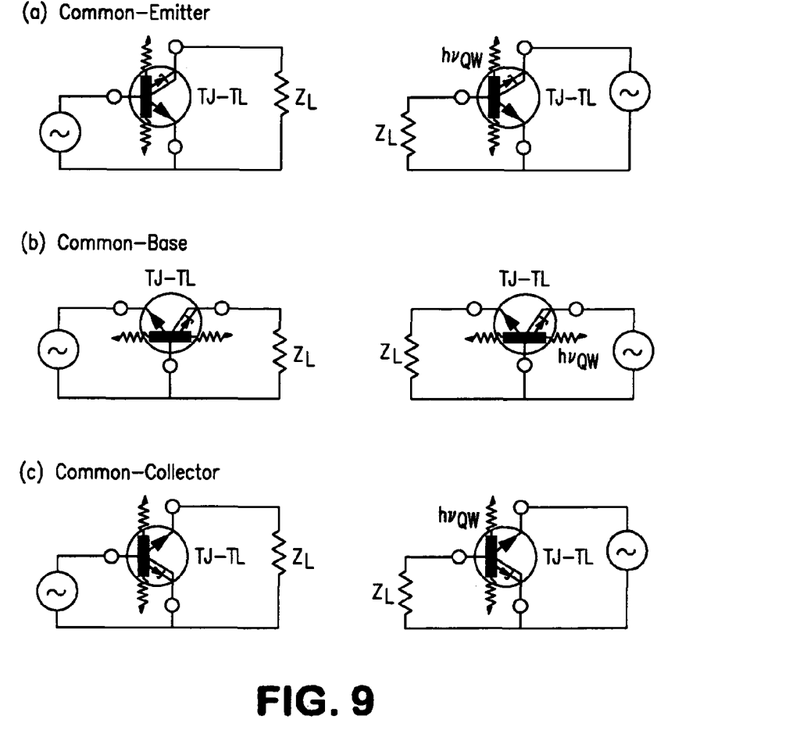
FIG. 9 shows the TJ-TL in (a) common-emitter, (b) common-base, and (c) common-collector configurations for the conversion of an electrical input to simultaneous optical and electrical outputs.

Moreover, in transistor form, the collector tunnel junction adds a new dimension to the design and choice of input-impedance matching for maximum power transfer. When compared to the comparison TL, the effective input impedance "looking into" the CE-input port is not necessarily large when the BC junction is reverse-biased, because the collector tunnel junction provides, in effect, a low-resistance (tunnel) path for current flow ($I_{fkT}$ and $I_{rT}$). For the common-emitter TJ-TL (common-collector and common-base configurations are also possible, see FIG. 9 for the various possible configurations), microwave S-parameter measurements yield impedances of magnitude 3-6Ω for the BE-input port, and 25-30Ω for the CE-input port. The higher CE-input port impedance is more suited for signal matching (50Ω standard) and voltage-controlled modulation. This is a major advantage (and opportunity for application) of the three-terminal TL compared to a two-terminal device.

Figure 10:
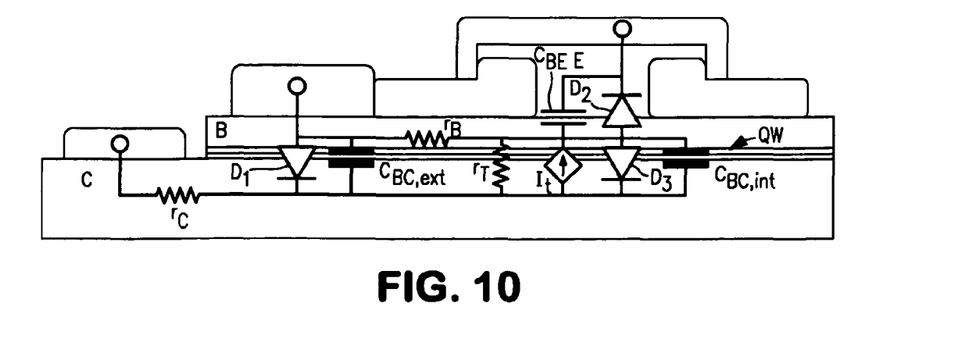
FIG. 10 shows an equivalent circuit model of the TJ-TL showing the collector tunneling process represented by a nonlinear resistor, $r_T$, in parallel with the extrinsic base-collector capacitance, $C_{BC,ext}$. In common-emitter configuration, $r_T$ routes RF (hole) currents more efficiently to the QW recombination center, and away from the extrinsic $C_{BC,ext}$ path, thus improving the RF signal isolation between the BE- and CE-ports.
Figure 11:
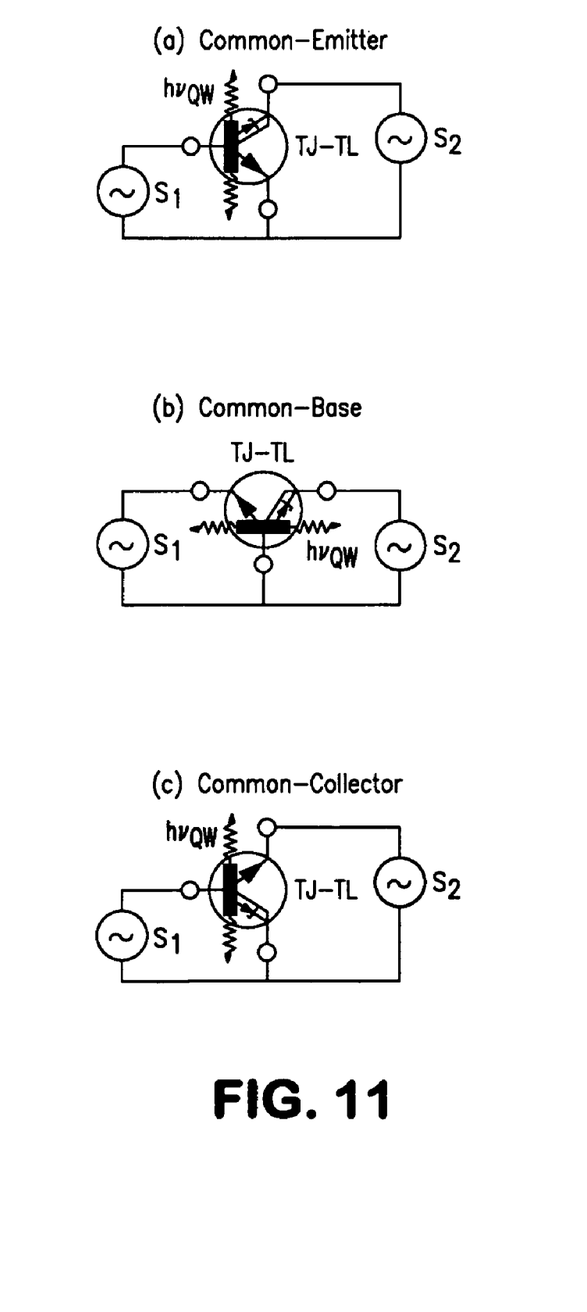
FIG. 11 shows a TJ-TL in (a) common-emitter, (b) common-base, and (c) common-collector configurations for signal mixing and conversion of two electrical inputs to an optical output.
Figure 12:
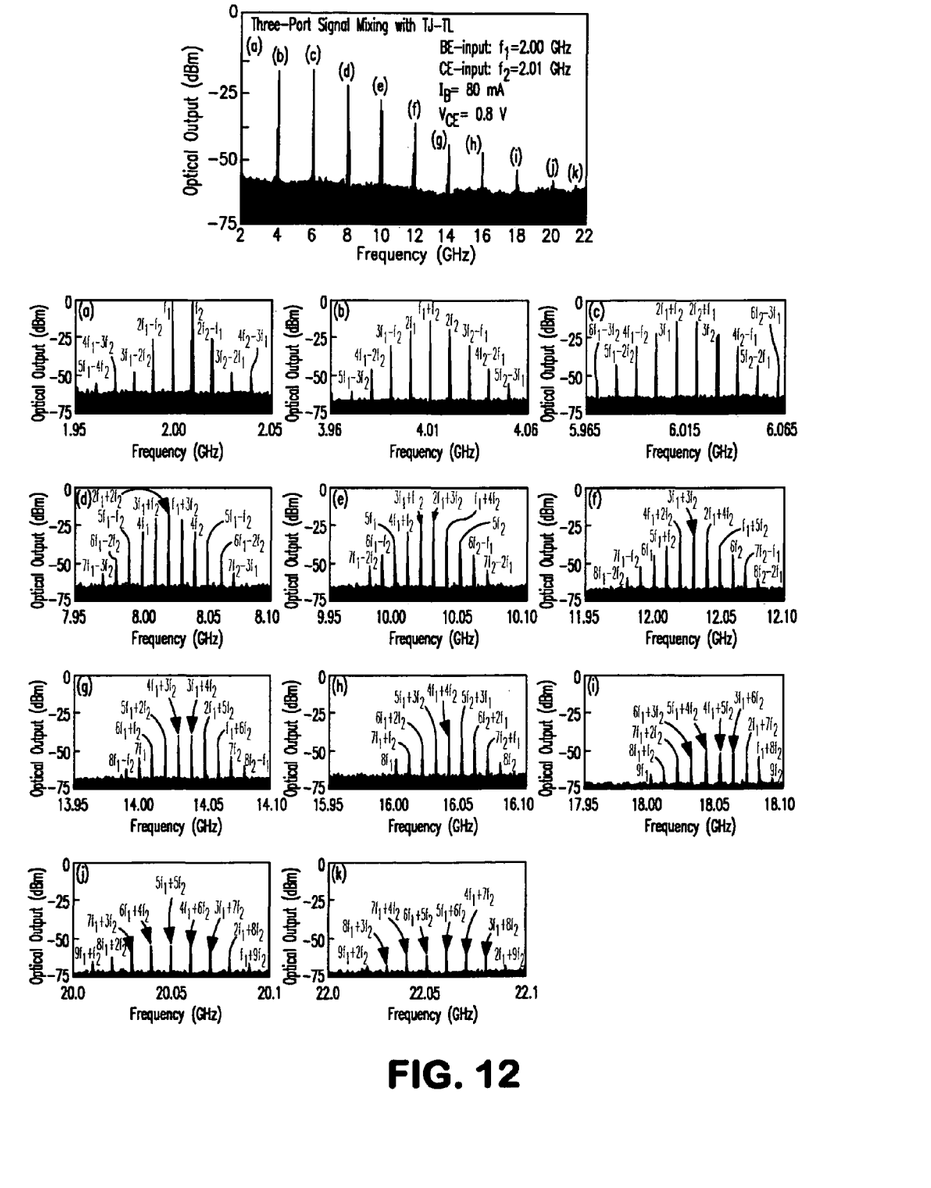
FIG. 12 shows signal mixing with a TJ-TL in the configuration shown in FIG. 11a, producing an optical output with harmonics, $mf_1+nf_2$. The smaller diagrams (a) through (e) show frequency components in further detail around the harmonic peaks labeled with corresponding letters.

The collector tunnel junction also provides improved isolation between the two electrical ports, overcoming the effects of any signal "shunts" between the two ports, created for instance, by an extrinsic base-collector capacitance, $C_{BC,ext}$ in a common-emitter transistor. FIG. 10 shows a schematic circuit equivalent model of the TJ-TL. E, B, and C respectively represent emitter, base, and collector. The resistors $r_B$ and $r_C$ respectively represent the base resistance and collector resistance, $C_{BE}$ represents the base-emitter junction capacitance, $I_t$ represents an active current dependent current source ($I_t = \beta I_B$), $D_1$ represents the extrinsic collector junction pn diode, $D_2$ represents the intrinsic emitter junction pn diode, and $D_3$ represents the intrinsic collector junction pn diode. Collector tunneling is represented as a non-linear resistor, $r_T$. The resistance, $r_T$, in parallel with $C_{BC,ext}$, provides a low-resistance path for routing current flows away from $C_{BC,ext}$, and directing them towards the relevant recombination center (i.e., electrical-to-optical conversion). The common-emitter TJ-TL employed in the present example gives two-port transconductances, $|y_{ij}|_{i \neq j}$ ($= |i_i/v_j|_{v_j=0}$), that are 10 dB less compared to the comparison TL, while maintaining $|s_{ij}|_{i \neq j}$ ($= |V_i^-/V_j^+|_{V_{=0}}$) of less than −20 dB over frequencies ranging from 0.050 to 20 GHz. The RF isolation between the two ports is advantageous for multiple-RF-input signal-processing applications such as signal mixing. To demonstrate this, the TJ-TL is employed in a common-emitter, dual-input configuration, as shown in FIG. 11(a). A single tone at frequency, $f_1 = 2.00$ GHz is provided at the BE-port of the TJ-TL, while another single tone at frequency, $f_2 = 2.01$ GHz is provided at the CE-port. The choice of $f_1$ and $f_2$ are made for the convenience of later identifying and enumerating the various harmonics that are present in the output optical signal. The mixing of both tones produces detectable harmonics as high as the $11^{th}$ order, with the highest harmonic (the present experimental apparatus has a 3 dB bandwidth limited to 20 GHz) being $9f_2 + 2f_1 = 22.09$ GHz (FIG. 12).

The foregoing has demonstrated, inter alia, a three-terminal tunnel junction transistor laser with a sensitive third terminal voltage control for its optical output. In addition to the usual direct current modulation capability, the collector tunnel junction enables a direct voltage-controlled absorption modulation of the TJ-TL using collector photon-assisted (FK) tunneling. A relatively "flat", resonance-free response with, advantageously, a comparatively larger usable bandwidth is obtained with the TJ-TL in forward-active mode. The photon-assisted tunneling at the collector junction provides an internal feedback loop that can potentially be employed for an efficient variety of circuit applications involving feedback signals. The collector tunnel junction offers improved isolation between the two electrical ports, and convenience in the design and choice of input-signal impedance matching opportunities, hence, making it advantageous for applications in signal processing.

The invention claimed is:

1. A method for producing light emission from a semiconductor device, comprising the steps of:
   providing a semiconductor base region disposed between a semiconductor emitter region and a semiconductor collector region that forms a tunnel junction adjacent said base region;
   providing, in said base region, a region exhibiting quantum size effects;
   providing an emitter terminal, a base terminal, and a collector terminal respectively coupled with said emitter region, said base region, and said collector region; and
   applying electrical signals with respect to said emitter terminal, said base terminal and said collector terminal to produce said light emission from said base region.

2. The method as defined by claim 1, wherein said step of providing, in said base region, a region exhibiting quantum size effects, comprises providing a quantum well in said base region.

3. The method as defined by claim 1, wherein said step of providing, in said base region, a region exhibiting quantum size effects, comprises providing a layer of quantum dots in said base region.

4. The method as defined by claim 1, further comprising the step of providing an optical cavity enclosing at least a portion of said base region, said light emission comprising laser emission.

5. The method as defined by claim 4, wherein said step of applying said electrical signals includes reverse biasing said tunnel junction; whereby electrons injected into the base region, via the emitter region, recombine, in the base region, with holes generated by the tunnel junction, contributing to said laser emission.

6. The method as defined by claim 5, wherein said step of applying said electrical signals includes providing input current to said base terminal to obtain further carrier recombination in said base region, also contributing to said laser emission.

7. The method as defined by claim 6, wherein said recombining, in said base region, is substantially aided by said region exhibiting quantum size effects.

8. The method as defined by claim 1, wherein said step of providing a semiconductor base region disposed between a semiconductor emitter region and a semiconductor collector region that forms a tunnel junction adjacent said base region includes: providing an emitter region that comprises an n-type layer; providing a base region that comprises a plurality of p+ layers; and providing a collector region that comprises an n+ layer adjacent a p+ layer of said base region to form said tunnel junction.

9. The method as defined by claim 4, wherein said step of providing a semiconductor base region disposed between a semiconductor emitter region and a semiconductor collector region that forms a tunnel junction adjacent said base region includes: providing an emitter region that comprises an n-type layer; providing a base region that comprises a plurality of p+ layers; and providing a collector region that comprises an n+ layer adjacent a p+ layer of said base region to form said tunnel junction.

10. The method as defined by claim 9, further comprising providing n-type cladding layers on said emitter layer and n-type cladding layers on said collector layer.

11. The method as defined by claim 1, wherein said step of providing semiconductor emitter, base, and collector regions comprises providing said regions as III-V semiconductor materials.

12. The method as defined by claim 9, wherein said step of providing semiconductor emitter, base, and collector regions comprises providing said regions as III-V semiconductor materials.

13. A three terminal semiconductor device for producing light emission in response to electrical signals, comprising:
   a semiconductor base region disposed between a semiconductor emitter region and a semiconductor collector region that forms a tunnel junction adjacent said base region;
   said base region having a region therein exhibiting quantum size effects;
   an emitter terminal, a base terminal, and a collector terminal respectively coupled with said emitter region, said base region and said collector region;
   whereby application of said electrical signals with respect to said emitter, base, and collector terminals, causes light emission from said base region.

14. The device as defined by claim 13, wherein said region exhibiting quantum size effects comprises a quantum well.

15. The device as defined by claim 13, wherein said region exhibiting quantum size effect comprises a layer of quantum dots.

16. The device as defined by claim 13, further comprising an optical cavity enclosing at least a portion of said base region, and wherein said light emission comprises laser emission.

17. The device as defined by claim 13, wherein said emitter region comprises an n-type layer; said base region comprises a plurality of p+ layers; and said collector region comprises an n+ layer adjacent a p+ layer of said base region to form said tunnel junction.

18. The device as defined by claim 16, wherein said emitter region comprises an n-type layer; said base region comprises a plurality of p+ layers; and said collector region comprises an n+ layer adjacent a p+ layer of said base region to form said tunnel junction.

19. A method for producing laser emission modulated with mixed signals representative of a first RF input comprising an input current and a second RF input comprising an input voltage, comprising the steps of:
   providing a semiconductor base region disposed between a semiconductor emitter region and a semiconductor collector region that forms a tunnel junction adjacent said base region;
   providing, in said base region, a region exhibiting quantum size effects;
   providing an optical cavity enclosing at least a portion of said base region;
   providing an emitter terminal, a base terminal, and a collector terminal respectively coupled with said emitter region, said base region, and said collector region; and
   applying electrical signals with respect to said emitter terminal, said base terminal and said collector terminal to produce said laser emission from said base region, said applying of electrical signals including application of said first RF input to said base terminal, and said applying of said electrical signals further including reverse biasing of said tunnel junction and application of said second RF input across said collector terminal with respect to another of said terminals.

20. The method as defined by claim 19, wherein said optical output includes mixed multiples of the frequencies of said first and second input signals.

21. The method as defined by claim 19, wherein said another of said terminals comprises said emitter terminal.

22. The method as defined by claim 19, wherein said another of said terminals comprises said base terminal.

* * * * *